(12) United States Patent
Sanchez et al.

(10) Patent No.: US 12,087,671 B2
(45) Date of Patent: Sep. 10, 2024

(54) OVERMOLDED MICROELECTRONIC PACKAGES CONTAINING KNURLED FLANGES AND METHODS FOR THE PRODUCTION THEREOF

(71) Applicant: NXP USA, INC., Austin, TX (US)

(72) Inventors: Audel Sanchez, Tempe, AZ (US); Jerry Lynn White, Glendale, AZ (US); Hamdan Ismail, Seremban (MY); Frank Danaher, Gilbert, AZ (US); David James Dougherty, Tempe, AZ (US); Aruna Manoharan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 87 days.

(21) Appl. No.: 17/213,641

(22) Filed: Mar. 26, 2021

(65) Prior Publication Data

US 2021/0217685 A1 Jul. 15, 2021

Related U.S. Application Data

(62) Division of application No. 16/034,223, filed on Jul. 12, 2018, now Pat. No. 10,998,255.

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49503* (2013.01); *H01L 21/4842* (2013.01); *H01L 21/4878* (2013.01); *H01L 21/56* (2013.01); *H01L 23/3121* (2013.01); *H01L 23/3142* (2013.01); *H01L 23/49568* (2013.01); *H01L 23/49575* (2013.01)

(58) Field of Classification Search
CPC ............... H01L 23/3736; H01L 23/367; H01L 23/4334; H01L 23/3107
See application file for complete search history.

(56) References Cited

U.S. PATENT DOCUMENTS

| 2004/0113262 A1* | 6/2004 | Elliott | H01L 21/4842 257/E23.092 |
| 2019/0043790 A1* | 2/2019 | Rodriguez | H01L 23/49503 |
| 2019/0198454 A1* | 6/2019 | Talledo | H01L 21/4828 |

\* cited by examiner

*Primary Examiner* — Julio J Maldonado
*Assistant Examiner* — Stanetta D Isaac

(57) ABSTRACT

Overmolded microelectronic packages containing knurled base flanges are provided, as are methods for producing the same. In various embodiments, the overmolded microelectronic package includes a molded package body, at least one microelectronic device contained in the molded package body, and a base flange to which the molded package body is bonded. The base flange includes, in turn, a flange frontside contacted by the molded package body, a device attachment region located on the flange frontside and to which the at least one microelectronic is mounted, and a knurled surface region. The knurled surface region includes a first plurality of trenches formed in the base flange and arranged in a first repeating geometric pattern. The molded package body extends or projects into the first plurality of trenches to decrease the likelihood of delamination of the molded package body from the base flange.

15 Claims, 10 Drawing Sheets

OVERMOLDED MICROELECTRONIC PACKAGES CONTAINING KNURLED FLANGES AND METHODS FOR THE PRODUCTION THEREOF

CROSS-REFERENCE TO RELATED APPLICATION

This application is a divisional of co-pending, U.S. patent application Ser. No. 16/034,223, filed on Jul. 12, 2018.

TECHNICAL FIELD

Embodiments of the present invention relate generally to microelectronic packaging and, more particularly, to microelectronic packages containing knurled base flanges enhancing mold-flange bond adhesion, as well as to methods for the production of microelectronic packages containing knurled base flanges.

BACKGROUND

By definition, an overmolded microelectronic package contains a base flange and a package body, which is molded over and bonded to the base flange during package fabrication. An overmolded microelectronic package may be produced via the injection of a selected mold compound, heated to a flowable state, into a tool cavity defining the shape of the molded package body and into which a base flange has been pre-inserted. The heated mold compound flows onto surfaces of the base flange and, upon cooling, forms a solidified package body. In certain instances, one or more microelectronic devices may be pre-mounted to the base flange prior to the overmolding process, in which case the molded package body may be formed as an essentially solid block of material encapsulating the microelectronic devices. Alternatively, the molded package body may be produced prior to microelectronic device attachment and formed to include an open cavity through which the frontside of the base flange is partially exposed. After formation of the package body, one or more microelectronic devices may be positioned in the open cavity, attached to the exposed portion of the flange frontside, and interconnected with the package leads. A lid or cover may then be positioned over and bonded to an upper peripheral edge of the package body to sealingly enclose the package cavity and the microelectronic devices contained therein.

Relative to other types of microelectronic packages, such as packages containing window frames, overmolded microelectronic packages can typically be produced at greater efficiencies and reduced manufacturing costs. These advantages notwithstanding, overmolded microelectronic packages remain limited in certain respects. As a primary limitation, separation or "mold-flange delamination" can occur at the interfaces between the overmolded package body and the base flange. Mold-flange delamination may be problematic in high temperature applications, particularly when the microelectronic package contains one or more semiconductor die composed of a high stiffness material, such as gallium nitride. To reduce the likelihood of mold-flange delamination, certain base flanges are now fabricated to include so-called "mold lock features" in the form of relatively large dove tail or half dove tail grooves. Such mold lock features are generally characterized by an overhang or "tail" feature, which partially encloses a peripheral groove formed around the flange frontside. During overmolding, the heated mold compound directed onto the flange frontside flows into the peripheral groove and beneath the overhang feature, thereby forming a relatively robust mechanical bond with the base flange upon cooling of the mold compound and formation of the molded package body.

BRIEF DESCRIPTION OF THE DRAWINGS

At least one example of the present invention will hereinafter be described in conjunction with the following figures, wherein like numerals denote like elements, and.

Figure 1:
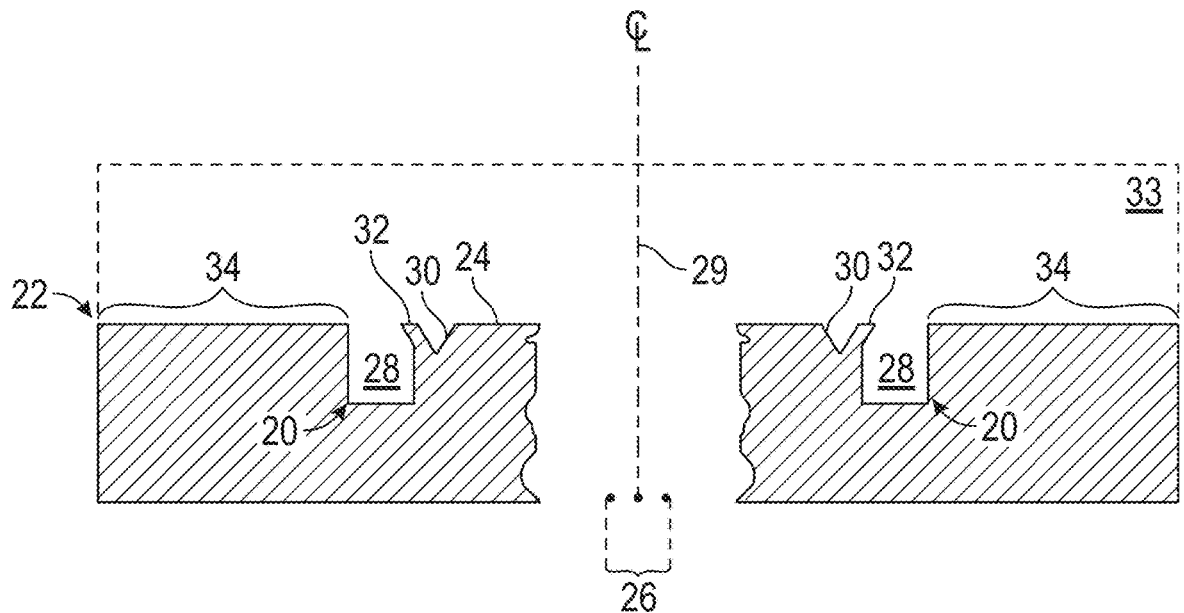
FIGS. 1 and 2 are cross-sectional views of a base flange (partially shown) having properly-formed and improperly-formed large-scale mold lock features, respectively, as illustrated in accordance with the teachings of prior art.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

Definitions

The following definitions apply throughout this document. Those terms not expressly defined here or elsewhere in this document are assigned their ordinary meaning in the relevant technical field.

Base Flange—a substrate or structure contained in a microelectronic package, supporting one or microelectronic devices, and possibly serving as a terminal and/or heatsink of the microelectronic package.

Overmolded microelectronic package—a microelectronic package including a package body, which is molded onto a base flange (defined above) and which defines or helps define an enclosure containing at least one microelectronic device.

Partially-enclosed trench—a trench or channel formed in a base flange (defined above) and including at least one overhang feature, such as a dove tail or half dove, which partially encloses or covers the trench.

U-shaped trench—a trench or channel formed in a base flange (defined above) having a rectangular or block-shaped cross-sectional geometry, as taken along a section plane orthogonal to the trench centerline and extending at least a majority of the trench length.

V-shaped trench—a trench or channel formed in a base flange (defined above) having a wedge-shaped cross-sectional geometry, as taken along a section plane orthogonal to the trench centerline and extending at least a majority of the trench length, such that the trench sidewalls diverge when moving away from the trench floor toward the trench mouth.

OVERVIEW

As noted above, overmolded microelectronic packages are now often fabricated utilizing base flanges having large-scale mold lock features to decrease the likelihood of mold-flange delamination. An example of a conventional mold lock feature 20, as properly formed in a base flange 22 having an upper surface or frontside 24, is shown in cross-section in FIG. 1. The central portion of base flange 22 is largely irrelevant for this discussion and is thus not shown in FIG. 1, as indicated by ellipsis symbol 26. Mold lock feature 20 includes an open groove 28, which is formed around an outer peripheral portion of flange frontside 24 and penetrates into flange 22 by some depth. Groove 28 extends fully around a centerline 29 of base flange 22 following a closed rectangular path, as viewed along centerline 29 looking downward onto flange frontside 24. Groove 28 has an open, rectangular cross-sectional shape in the example of FIG. 1 and is consequently referred to hereafter as a "U-groove 28." A smaller notch 30 is further formed in flange frontside 24 adjacent U-groove 28. Notch 30 is located inboard of U-groove 28 (that is, located closer to flange centerline 29) and likewise follows a rectangular planform path, which flanks the inner periphery of groove 28. Notch 30 has a V-shaped or wedge-shaped cross-sectional geometry in FIG. 1 and is thus referred to hereafter as "V-notch 30."

When properly located relative to U-groove 28, as shown in FIG. 1, V-notch 30 forms an overhang or encroachment feature in the form of a half dove tail 32. Half dove tail 32 extends fully around an inner perimeter of U-groove 28 to partially cover or enclose U-groove 28, as viewed along flange centerline 29 from a top-down or planform perspective. During overmolding, a heated mold compound is directed onto the illustrated region of flange frontside 24 including mold lock feature 20 and outer peripheral region 34 of flange frontside 24. As the mold compound spreads across flange frontside 24, the mold compound ingresses into U-groove 28 and fills the space beneath half dove tail 32. When subsequently allowed to cool, the mold compound forms a molded package body 33 bonded to flange frontside 24, as indicated in FIG. 1 by phantom line. In this manner, molded package body 33 is produced to include a lower lip or extension, which extends into base flange 22 to occupy mold lock feature 20 and create a relatively robust mechanical bond between flange 22 and package body 33.

Mold lock feature 20 may be produced utilizing a two step stamping process. An initial stamping step may be performed utilizing a first stamping die from which a ring-shaped protrusion having block-shaped cross-section extends. The ring-shaped protrusion defines U-groove 28, absent half dove tail 32, when pressed into flange frontside 24 with sufficient force. After formation of U-groove 28, a second stamping step is performed utilizing a second stamping die, which similarly includes a ring-shaped protrusion having a V-shaped cross-section. This protrusions defines V-notch 30 when the second die is pressed into flange frontside 24. Providing the second stamping die is precisely aligned relative to U-groove 28, the second stamping step causes the interior or inboard sidewall of U-groove 28 (that is, the sidewall of U-groove 28 closest flange centerline 29) to deform inwardly toward the center of U-groove 28 and form half dove tail 32. Precision alignment between the second stamping die and U-groove 28 can be difficult to achieve, however, particularly across multiple process iterations. Consequently, misalignment between the second, "V-notch" stamping die and U-groove 28 can occur during flange manufacture at an undesirably high rate. Depending upon its severity, such stamping die misalignment may result in the malformation or non-formation of half dove tail 32, thereby greatly reducing the effectiveness of mold lock feature 20.

Figure 2:
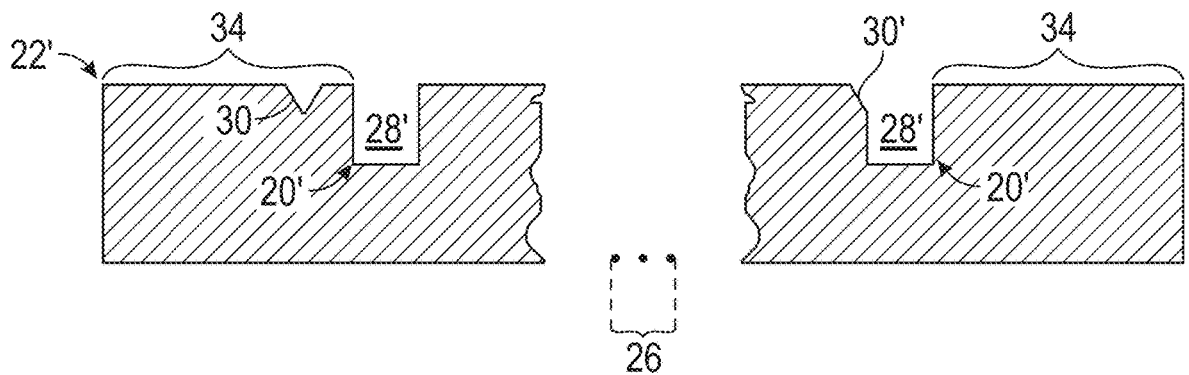

FIG. 2 illustrates a variation of base flange 22', which may be produced during flange fabrication when misalignment occurs between the V-notch stamping die and U-groove 28'. Base flange 22' is similar to base flange 22 shown in FIG. 1, but differs due to the malformation or non-formation of the above-described half dove tail feature. The reference numerals appearing in FIG. 1 have thus been carried-over to FIG. 2, but with the addition of a prime (') symbol to indicate that such features may differ to varying extents. The potential consequences of two types of stamping die misalignment are shown in FIG. 2. First, as shown on the left side of FIG. 2, the consequence of stamping die misalignment resulting in an offset of V-notch 30 away from the center of the adjacent portion of U-groove 28 is depicted. As can be seen, this misalignment has resulted in the failed formation of half dove tail 32 (FIG. 1) due to the relatively large offset of V-notch 30 away from U-groove 28. Similarly, as shown on the right side of FIG. 2, stamping die misalignment has resulted in an offset of V-notch 30 toward the center of the adjacent portion of U-groove 28 and the failed formation of half dove tail 32 (FIG. 1). Thus, in both instances, stamping die misalignment results in the non-formation or the malformation of half dove tail 32 (FIG. 1), negatively impacting the effectiveness of mold lock feature 20.

Stamping die misalignment, such as that illustrated in FIG. 2, can be difficult to avoid on a repeated basis without adding undesired cost and delay to the manufacturing process utilized to create large-scale mold lock feature 20 in base flange 22. Consequently, base flanges containing conventional mold features, such as mold lock feature 20, can be undesirably costly to produce due to high scrap rates if stringent manufacture tolerances are mandated; or, instead, undesirably prone to variations in actual enhancements in mold-flange bond adherence if more laxed manufacturing tolerances are permitted. Furthermore, even in instances in which half dove tail 32 (or a similar mold lock feature) is properly formed in flange frontside 24 as shown in FIG. 1, bond strength between base flange 22 and molded package body 33 may remain undesirably limited. This may be due, at least in part, to the substantially planar or flat geometry of outer peripheral region 34, which typically occupies a greater percentage of flange frontside 24 than does mold lock feature 20. For at least these reasons, there exists an ongoing demand within the microelectronics industry for improved base flange, which achieve further enhancements in bond adherence at the mold-flange interfaces. Ideally, such improved base flanges, and the overmolded microelectronic packages incorporating such base flanges, would also be amenable to manufacture on a relatively low cost and repeatable basis.

The following provides overmolded microelectronic packages containing knurled base flanges, which significantly enhance bond strength between the base flange and the overmolded package body. Specifically, the base flanges are fabricated to include strategically positioned knurled surface regions, which are defined by a plurality of small scale trenches (or other depressions) spatially distributed in a repeating geometric pattern. The knurled surface region of base flange usefully extend around a device attachment region further provided on the flange frontside and to which one or more microelectronic devices are mounted either prior to the overmolding process (as may be the case when the molded package body is formed as an essentially solid block of material) or after the overmolding process (as may be the case when the molded package body is formed as a peripheral wall bordering the periphery of an air cavity in which one or more microelectronic devices are subsequently installed). The knurled surface region usefully, although non-essentially occupies a majority of the surface area of the flange frontside contacted by and bonded to the overmolded package body. Furthermore, in certain embodiments, the knurling or repeating trench pattern may be provided on other surfaces of the base flange contacted by the molded package body, such as the flange sidewalls or backside.

The knurled surface region or regions of the base flange enhance bond adhesion with the molded package body, at least in part, through an increase in bondable surface area; that is, the cumulative surface area availed for direct contact with and bonding to the molded package body. For example, depending upon the dimensions and spatial arrangement of the trenches (and/or other depressions) contained in the knurling pattern, embodiments of the below-described knurling patterns can achieve a surface area enlargement greater than 50% and, perhaps, a surface area enlargement approaching or exceeding 85% relative to a flat or planar surface of equivalent dimensions. Additionally, in at least some implementations, trenches contained in the knurling pattern may have partially-enclosed cross-sectional geometries, as taken along at least one section plane orthogonal to the trench length. Thus, in such implementations, the partially-enclosed trenches may collectively function as a relatively large number of small-scale mold lock features, which further enhance mold-flange bond adherence. Incorporation of a base flange having such knurled surface regions into an overmolded microelectronic package can consequently decrease the likelihood of mold-flange delamination during package usage, as may be particularly beneficial when the microelectronic package is exposed to highly elevated operating temperatures and/or contains semiconductor die composed of gallium nitride (GaN) or a similar high stiffness material. An example of a knurled base flange, as incorporated into an overmolded microelectronic package, will now be described in conjunction with FIGS. 1-6.

Figure 3:
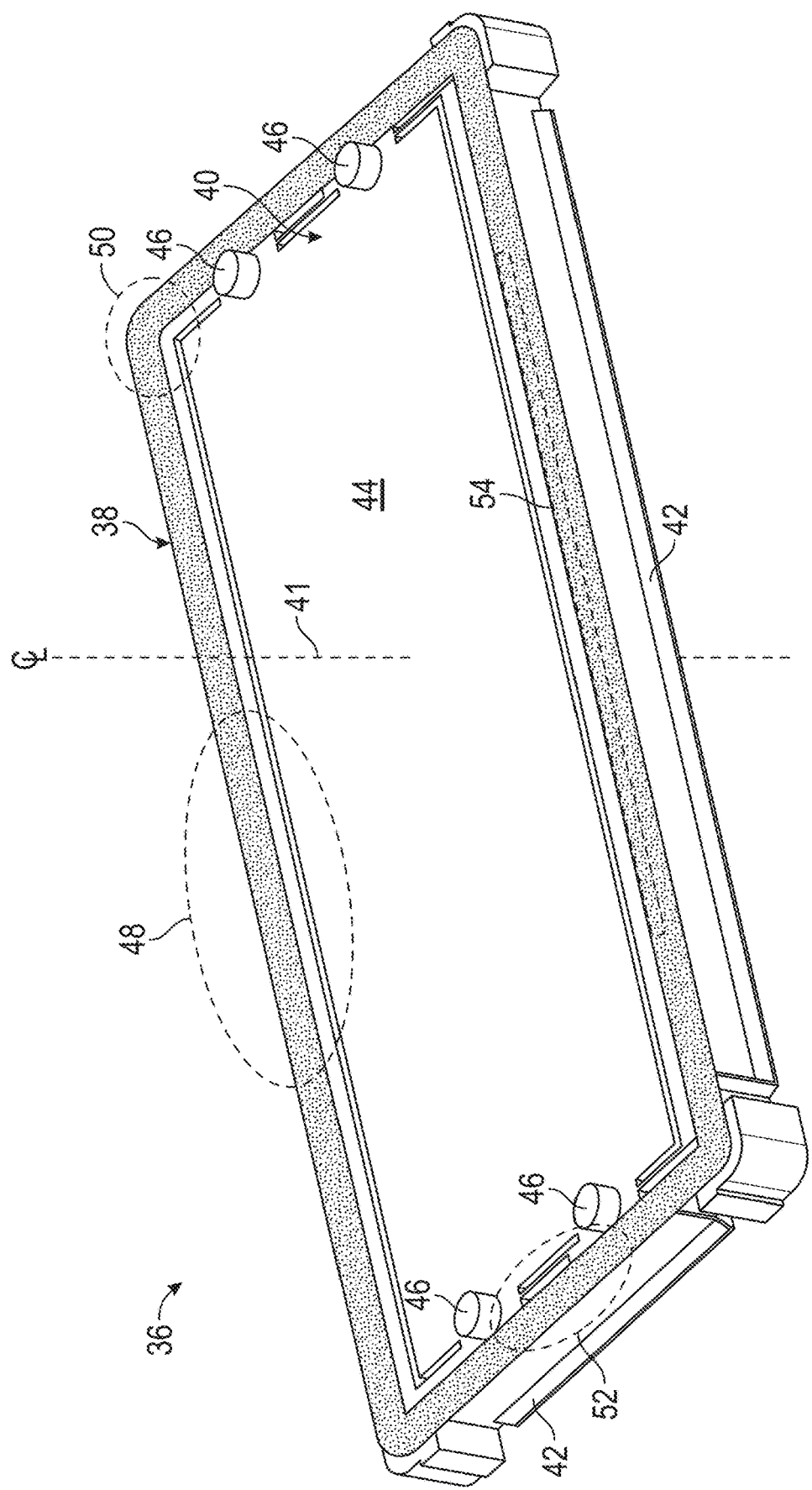
FIG. 3 is an isometric view of a knurled base flange, as illustrated in accordance with an exemplary embodiment of the present disclosure.

Non-Limiting Example of Knurled Base Flange and Overmolded Microelectronic Package Containing the Same Referring now to FIG. 3, a base flange 36 having a knurled surface region 38 (represented by dot stippling) is depicted in accordance with an exemplary embodiment of the present disclosure. Knurled surface region 38 is formed on an upper surface or frontside 40 of base flange 36, with processes suitable for forming surface region 38 discussed below in conjunction with FIGS. 7-13. Knurled surface region 38 can be formed at any desired location on flange frontside 40; and, in certain cases, may occupy the entirety or substantial entirety of frontside 40, providing this does not interfere with device attachment. In the example of FIG. 3, specifically, knurled surface region 38 is formed as a continuous band or complete ring, which extends around an outer peripheral portion of flange frontside 80. Knurled surface region 38 thus follows a rectangular planform path, which circumscribes and may be centered with respect to flange centerline 41. In alternative embodiments, knurled surface region 38 may be provided in multiple discrete areas (e.g., as a discontinuous or broken band), which are strategically distributed across flange frontside 40 for bonding with the below-described package body. Knurled surface region 38 may also be formed on flange sidewalls 42 in implementations in which the subsequently-formed molded package body contacts and is bonded to sidewalls 42. This is unnecessary, however, and can potentially increase manufacturing complexity depending upon the particular method by which knurled base flange 36 is produced.

Knurled surface region 38 can contain any particular number and type of depressions, such as channels or trenches, which are arranged in a repeating geometric pattern and which enhance mold-flange bond adhesion. In many embodiments, base flange 36 may include a single or uniform repeating geometric pattern, such as any one of the knurling patterns described below in conjunction with FIGS. 8, 10, and 14, formed across the entirety of knurled surface region 38. It is however possible that disparate or varied knurling patterns may be imparted to different portions or sections of knurled surface region 38, as desired. This latter possibility is generically indicated in FIG. 3 by dashed circles 48, 50, and 52, which may contain different knurling patterns in at least some instances; e.g., by way of arbitrary example, circles 48, 50, and 52 may contain the knurling patterns shown in FIGS. 8, 10, and 12, respectively, as described below. Additionally, for completeness, it is also observed that knurled surface region 38 may be formed in combination with a traditional large-scale mold lock feature, such as a dove tail or half dove tail groove. This possibility is further indicated in FIG. 3 by dashed rectangle 54, which generally represents a portion of a dove tail or half dove tail groove, such as mold lock feature 20 shown in FIG. 1. Such possibilities notwithstanding, knurled surface region 38 will often be produced to include single, repeating geometric pattern and may replace (rather than be formed in combination with) conventional mold lock features, such as mold lock feature 20 described above in connection with FIG. 1.

With continued reference to FIG. 3, knurled base flange 36 further includes a device attachment region 44 to which one or more microelectronic devices, such as semiconductor die, may be mounted. Device attachment region 44 is centrally located on flange frontside 40 and may have a substantially planar or flat topology in embodiments; the term "flat" and "planar" utilized interchangeably herein to refer to a surface having a roughness (average surface feature height or depth) less than of knurled surface region 38 and, perhaps, less than 1 micron. A number of locating or retention posts 46 project upwardly from flange frontside 40. Retention posts 46 may be utilized to secure base flange 36 to a leadframe during package fabrication, as discussed more fully below in conjunction with FIG. 4. Retention posts 46 may be located adjacent an interface or boundary separating device attachment region 44 and knurled surface region 38 in an embodiment. Further, knurled surface region 38 is usefully, although non-essentially formed to extend fully around an outer peripheral portion of flange frontside 40 and, therefore, may surround or flank device attachment region 44 on all sides.

Knurled base flange 36 can be realized as any body of material, layered or laminated structure, or other substrate suitable for supporting one or more microelectronic devices and having at least one knurled surface region. In certain embodiments, knurled base flange 36 may serve as a heatsink and/or an electrically-conductive terminal of the subsequently-produced overmolded microelectronic package. By way of example, base flange 36 may assume the form of a monolithic metallic structure, plate, slug, or the like in certain implementations. In other embodiments, knurled base flange 36 may have a multilayer metallic construction; e.g., base flange 36 may contain multiple thermally-conductive layers, which are bonded in a stacked or laminated arrangement. Knurled base flange 36 will typically be composed predominately of one or more metals having relatively high thermal conductivities, such as copper (Cu). As a more specific example, in an embodiment in which knurled base flange 36 is a layered or laminated structure, base flange 36 may include at least one Cu layer combined with at least one disparate metal layer having a Coefficient of Thermal Expansion (CTE) less than that of the Cu layer. The disparate metal layer may be composed of, for example, Molybdenum (Mo), a Mo—Cu alloy, or a Mo—Cu composite material. In this manner, base flange 36 may be imparted with both a relatively high thermal conductivity and a lower effective CTE.

Figure 4:
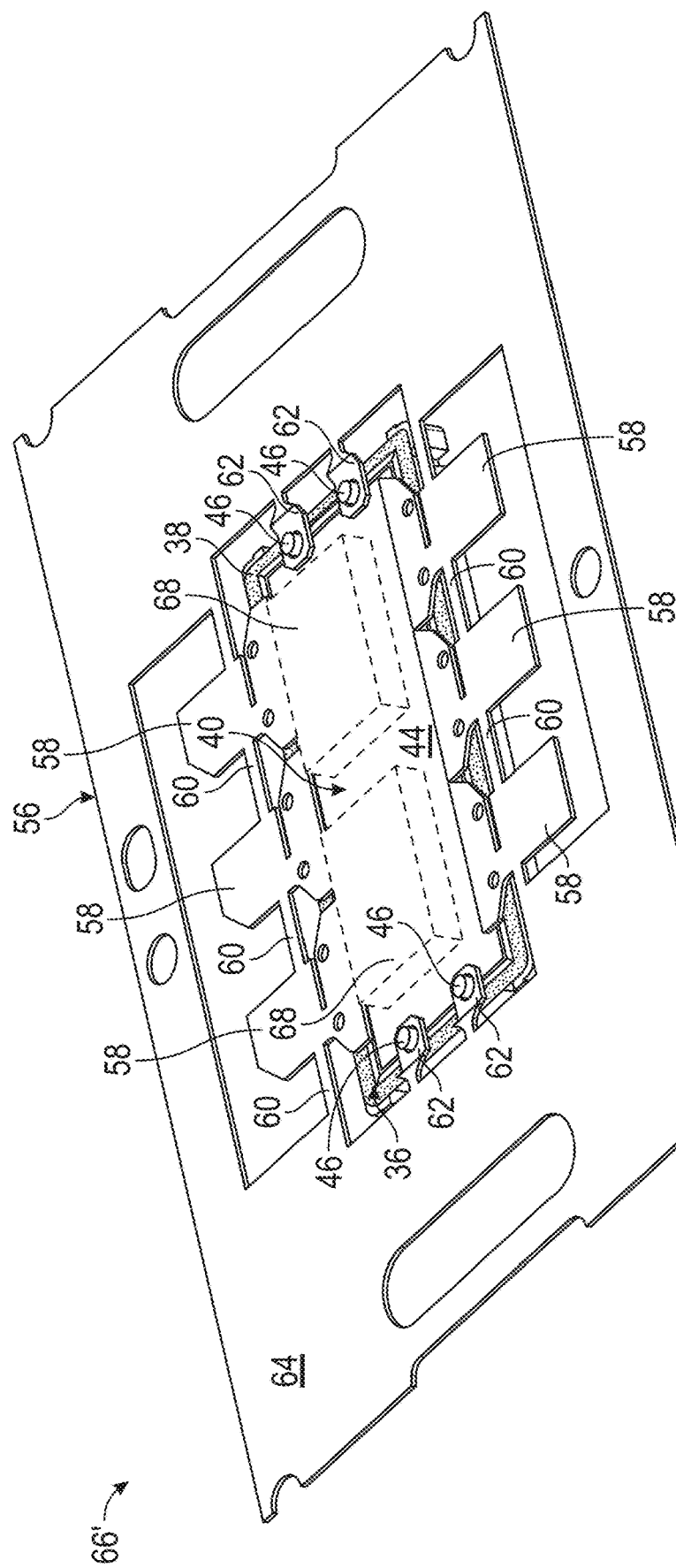
FIGS. 4 and 5 are isometric views of an overmolded microelectronic package fabricated utilizing the knurled base flange shown in FIG. 3 and illustrated at different stages of manufacture.

Advancing to FIG. 4, knurled base flange 36 is illustrated after attachment to a leadframe 56 during the course of an exemplary overmolded microelectronic package fabrication process. The exemplary fabrication process is utilized to manufacture at least one overmolded microelectronic package identified in FIG. 4 by reference numeral "66'," with the prime symbol (') utilized to indicate that microelectronic package 66' is shown in a partially-completed state. The below-described process steps can be performed to produce overmolded microelectronic package 66, as shown in a completed state in FIG. 6, on an individual basis. Alternatively, the below-described process steps may be conducted more globally to produce any practical number of like microelectronic packages in parallel with illustrated overmolded microelectronic package 66; e.g. by processing a number of leadframes 56 interconnected in, for example, a two dimensional grid layout or a linear strip layout.

Leadframe 56 includes a number of package leads 58, which are physically-interconnected with one another and with other leadframe features at the stage of manufacture depicted in FIG. 4. Leadframe 56 can provided as a relatively thin strip or plate-like body composed of a metallic material, such as Cu or a Cu-based alloy. The body of leadframe 56 is machined (e.g., stamped), etched, laser cut, or otherwise processed to define the various leadframe features of leadframe 56. In addition to package leads 58, the leadframe features may include a central opening through which device attachment region 44 of flange frontside 40 is exposed, as viewed downwardly along centerline 41 (FIG. 3); a number of connective fingers or spars (herein, "dam bars 60"); and an outer peripheral leadframe portion 64. Dam bars 60 join package leads 58 to the plate-like body of leadframe 56. Additionally, dam bars 60 may facilitate handing and positioning of leadframe 56 leading into and/or during the below-described overmolding process. After overmolding, dam bars 60 may be severed and removed along with other sacrificial leadframe portions, such as outer peripheral leadframe portion 64. Outer peripheral leadframe portion 64 may likewise include various openings or cutouts facilitating handling of leadframe 56 during package fabrication.

Leadframe 56 further includes a plurality of retention tabs 62. The inner terminal ends of retention tabs 62 are imparted with openings, through-holes, or apertures. These openings serve as locating or registration features, which receive corresponding raised locating features, such as staking posts of the type described below, to position base flange 36 relative to leadframe 56 and package leads 58. When base flange 36 is properly positioned with respect to leadframe 56, retention posts 46 project upwardly from frontside 40 of base flange 36 and are received through the openings provided in retention tabs 62, as shown in FIG. 4. In certain embodiments, a staking operation is then performed to physically deform each retention post 46 after insertion through the corresponding retention tab openings. This mechanically captures base flange 36 against leadframe 56. Further description of such a staking operation can be found in the following U.S. patent application, which is incorporated by reference: U.S. patent application Ser. No. 15/670,429, filed with the USPTO on Aug. 7, 2017, and entitled "MOLDED AIR CAVITY PACKAGES AND METHODS FOR THE PRODUCTION THEREOF." In other embodiments, retention posts 46 may be deformed in a different manner (e.g., by crimping or bending); or retention posts 46 may not be deformed to capture base flange 36 against leadframe 56.

Following attachment of base flange 36 to leadframe 56, either overmolding or microelectronic device attachment and interconnection may next be carried-out. When producing an overmolded air cavity package, the molded package body may be produced prior to device attachment and interaction. In this case, the molded package body may be produced to include an open cavity through which device attachment region 44 of flange frontside 40 is exposed. After overmolding and formation of the molded package body, one or more microelectronic devices may be positioned in the open cavity, bonded to device attachment region 44 (e.g., utilizing a die attach material), and electrically interconnected (e.g., by wirebonding) with the interior portions or "bond pad shelves" of package leads 58. A lid or cover may subsequently be positioned over and bonded to an upper peripheral edge of the newly-formed molded package body to sealingly enclose the air cavity and the microelectronic devices contained therein. In other approaches, overmolding and formation of the molded package body is performed after microelectronic device attachment and interconnection, as further discussed below.

Figure 5:
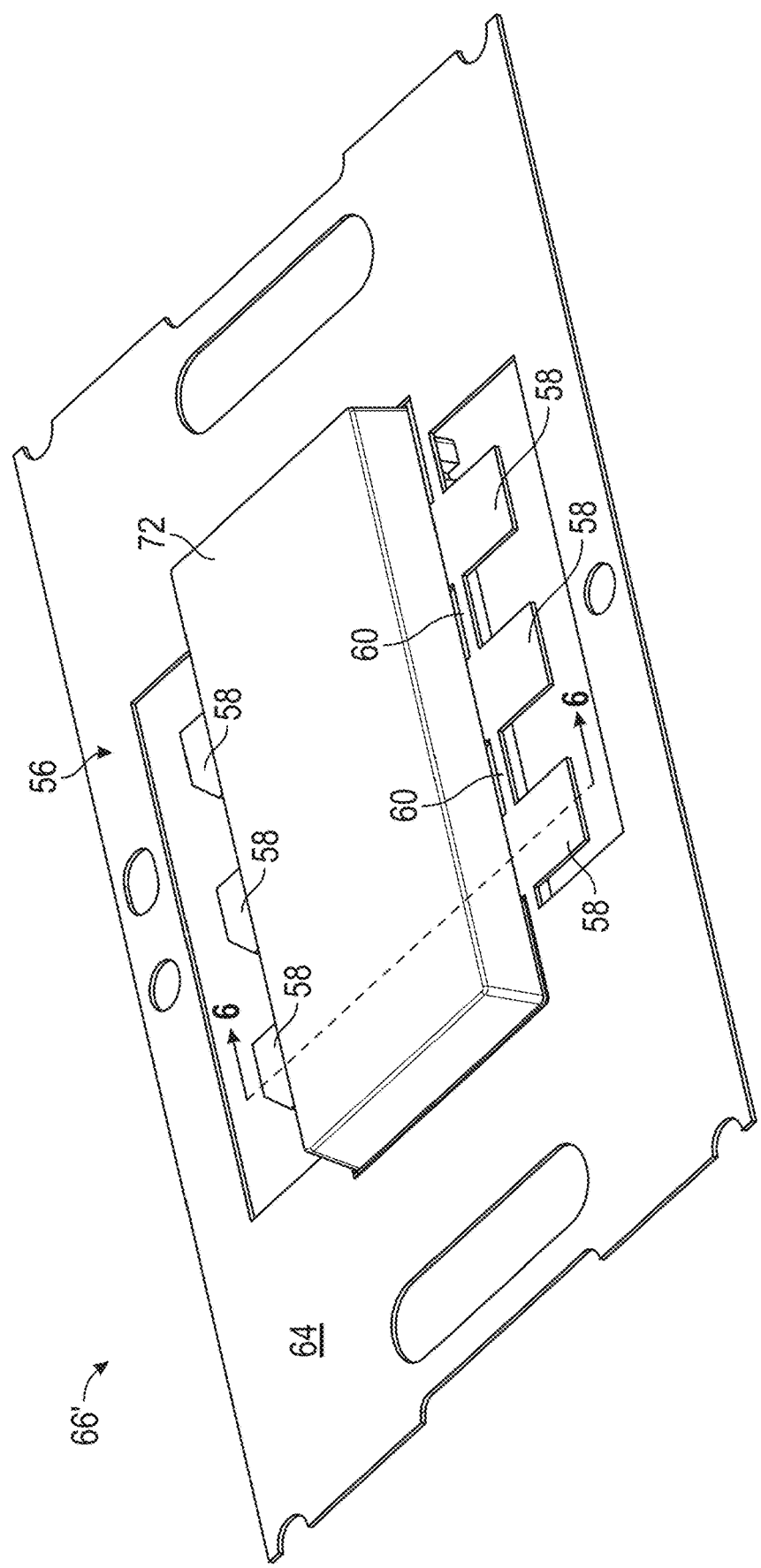

FIG. 4 further illustrates two microelectronic devices 68 (shown in phantom), which may be bonded to device attachment region 44 of flange frontside 40. Microelectronic devices 68 can be, for example, any combination of semiconductor die bearing integrated circuitry, microelectromechanical systems (MEMS) devices, and discrete passive components, such as discrete inductors, resistors, capacitors (chip-caps), or diodes. In one embodiment, microelectronic devices 68 are high powered semiconductor die bearing radiofrequency (RF) circuitry and composed of GaN. In further embodiments, overmolded microelectronic package 66 can be produced to contain a different number and type distribution of microelectronic devices 68. Candidate bonding materials for attachment of devices 68 include die attach materials, epoxies, solder materials, and sintered metallic materials of the type discussed in the above-identified U.S. patent application incorporated by reference. After device attachment, the appropriate electrical interconnections may be completed utilizing wirebonding or another approach suitable for electrically coupling the terminals of devices 68 to corresponding bond pad shelves 70 of package leads 58 (identified in FIG. 6). Afterwards, overmolding is performed to produce a molded package body encapsulating microelectronic devices 68, the newly-formed interconnect features (not shown), and an interior portion of leadframe 56. An example of such a molded package body 72, as formed over microelectronic devices 68 and an interior portion of leadframe 56, is shown in FIG. 5.

After overmolding and formation of molded package body 72 (FIG. 5), singulation may be conducted to remove or trim away selected portions of leadframe 56. The trimmed portions of leadframe 56 include dam bars 60 and outer peripheral leadframe portion 64. After dam bars 60 have been severed and partially or wholly trimmed away, retention tabs 62 are no longer physically and electrically coupled to package leads 58 through dam bars 60 and are now electrically isolated. Processes suitable for leadframe singulation include, but are not limited to, sawing, laser cutting, water jetting, stamping, scribing, and routing. Leadframe singulation yields a completed microelectronic package 66, as shown in cross-section in FIG. 6.

Figure 6:
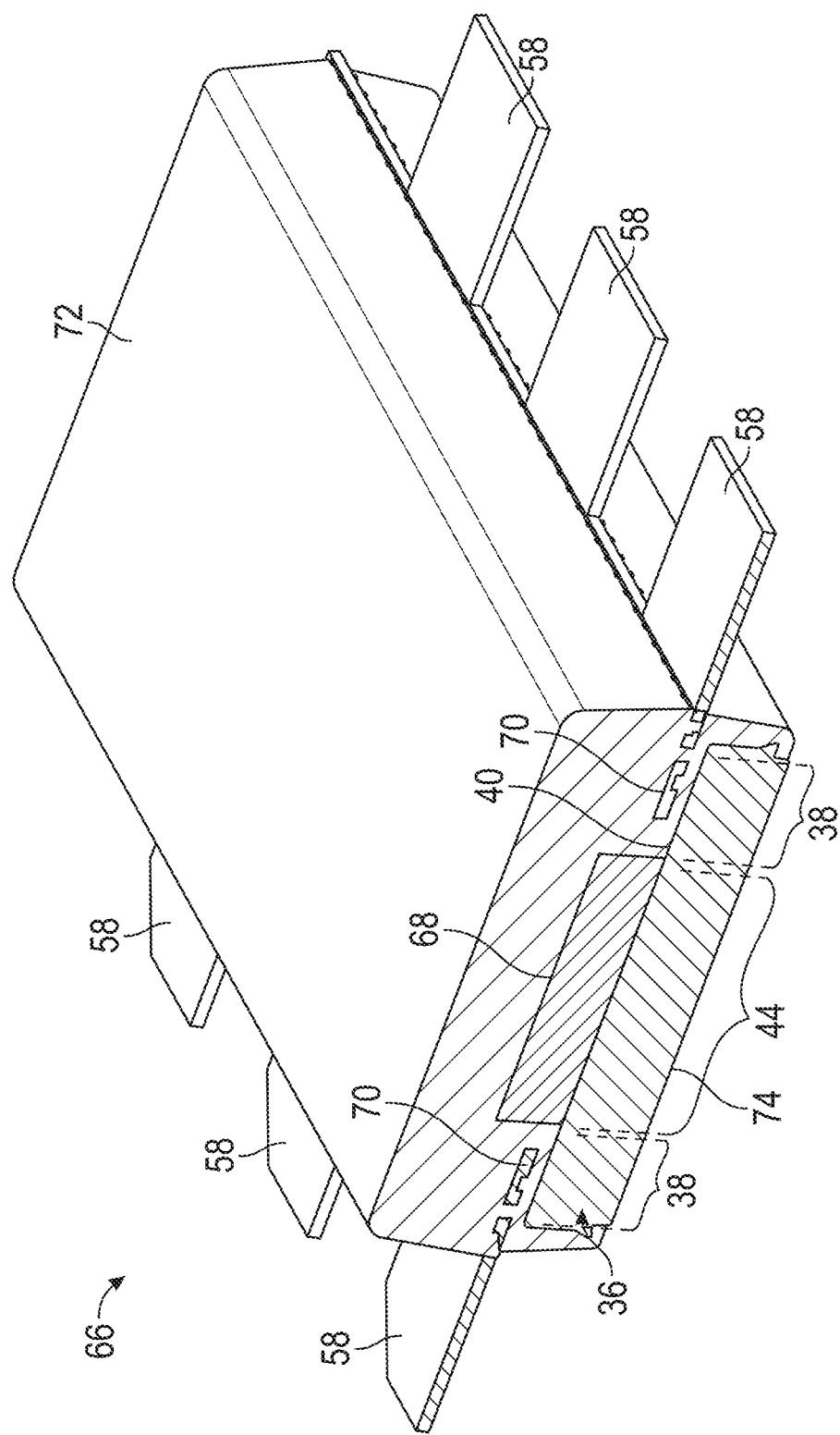
FIG. 6 is a cross-sectional view of the overmolded microelectronic package shown in FIGS. 4-5, as illustrated in a completed state and taken along section plane 6-6 identified in FIG. 5.

In the exemplary embodiment of FIG. 6, molded package body 72 is produced as an essentially solid block of material, which includes a lower central opening through which backside 74 of base flange 36 is exposed. Molded package body 72 intimately contacts and is bonded to the sidewalls of base flange 36 in the illustrated example, as well as to flange frontside 40 including knurled surface region 38. Molded package body 72 covers at least the majority, if not the substantial entirety of knurled surface region 38. In other embodiments, molded package body 72 can assume other forms, providing that some portion of package body 72 is molded directly onto and, therefore, bonded to knurled surface region 38. For example, in further embodiments, molded package body 72 can be formed as a peripheral sidewall, which extends around knurled surface region 38 to define an air cavity through which device attachment region 44 is exposed. The air cavity may then be sealingly enclosed via the attachment of a cover piece or lid over the upper peripheral edge of molded package body 72. In such embodiments, device attachment and interconnection can be performed either prior to or following formation of molded package body 72 during the overmolding process.

Knurled surface region 38 contains relatively large number of small scale channels or trenches, which are arranged or spatially distributed in a repeating geometric pattern referred to as a "knurling pattern." Due to the presence of such small-scale trenches, the surface area of flange frontside 40 available for bonding with molded package body 72 is increased. Additionally, in embodiments, knurled surface region 38 may occupy a majority of surface area of flange frontside 40 contacted by and bonded to molded package body 72. Stated differently, flange frontside 40 may have a total surface area $A_1$ contacted by molded package body 72, while knurled surface region 38 occupies at least a majority of the total surface area $A_1$. This further maximizes the cumulative surface availed for bonding with molded package body 72 as compared to, for example, conventional base flange 22 shown in FIG. 1; noting, here, the planar or flat surface topology of outer peripheral region 34, which occupies a substantial portion, if the not the majority (by surface area) of frontside 24 of base flange 22. Further, in at least some implementations, some or all of the trenches contained the knurling pattern are imparted with a partially-enclosed cross-sectional geometry, as taken in at least one section plane orthogonal to the centerline of the trench. In such embodiments, the partially-enclosed trenches effectively serve as a relatively large number of small-scale mold lock features, which further strengthen bond adhesion with a molded package body 72. This broader context now provided, examples of possible knurling patterns and methods for fabricating knurled base flange, such as base flange 36 shown in FIGS. 3-6, will now be described in conjunction with FIGS. 7-15.

Examples of Base Flanges Having Knurled Surface Regions and Methods for the Fabrication Thereof Embodiments of the above-described knurled base flange are amenable to fabrication utilizing repeatable, relatively low cost manufacturing processes. Generally, such processes entail the initial production of a partially-completed or intermediate base flange having a first stage knurling pattern. The first stage knurling pattern may contain or consist of non-enclosed depressions, such as channels or trenches, spatially arranged in a repeating geometric pattern. As indicated by the term "non-enclosed," the initially-formed trenches may have trench sidewalls, which extend substantially parallel to one another or, instead, which diverge laterally (spread apart) when moving from the trench floor toward the trench mouth. The first stage knurling pattern may be created in a pre-fabricated blank utilizing a material removal process, such as etching or machining, or a material shaping (forming) process, such as stamping. Alternatively, the first stage knurling pattern may be created as an integral feature upon initial base flange manufacture when the base flange is produced utilizing, for example, a casting or additive manufacturing process as discussed below.

After formation of the first stage knurling pattern, at least one final material shaping process is performed. The latter material shaping process may transform the first stage knurling pattern into a final knurling pattern containing and, perhaps, consisting of a repeating geometric arrangement of trenches, some or all of which may have a partially-enclosed cross-sectional shape. For example, in certain embodiments, a spanking process is performed to partially collapse the trench walls inwardly and thereby yield a repeating pattern of trenches with partially-enclosed geometries. In other embodiments, a stamping process may be conducted to impose or overlay a second trench pattern onto the first trench pattern. For example, in this latter regard, a second trench pattern may be pressed into or physically imposed over a region of the base flange imparted with the first stage knurling pattern. At least a majority of the second trench pattern may overlap with at least a majority of the first trench pattern; and, in at least some embodiments, the first and second trench patterns may overlap in their substantial entireties. In certain implementations, the second trench pattern may be formed to contain or consist of (e.g., V-shaped) trenches, which intersect the (e.g., U-shaped) trenches contained in the first stage knurling pattern to yield a latticework of crossing trenches. This may, but need not necessarily result in the collapse of sections or portions of the trenches contained in the first stage knurling pattern to impart such trenches with a partially-enclosed cross-sectional geometry adjacent the trench-to-trench intersections, as described more fully in conjunction with FIGS. 12-14.

Figure 7:
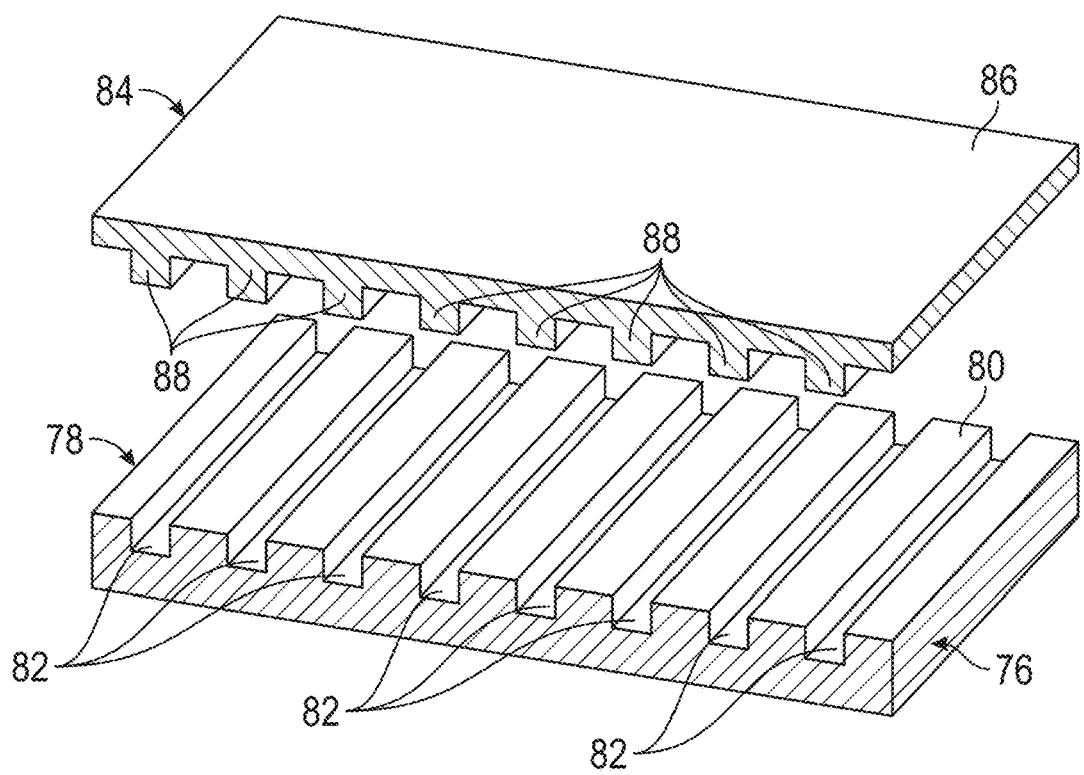
FIGS. 7-9 illustrate a limited region of a knurled base flange, such as base flange shown in FIGS. 1-6, shown at various stages of completion and imparted with a first exemplary knurling pattern.

Turning now to FIG. 7, there is shown a limited region of a partially-fabricated base flange 76, which may correspond to circled area 48 of base flange 36 (FIG. 3) in certain embodiments. Accordingly, base flange 76 may be considered equivalent to base flange 36 contained in overmolded microelectronic package 66 shown in FIGS. 3-6, albeit shown at an intermediate stage of manufacture in FIG. 7. An initial or first stage knurling pattern 78 has been created in frontside 80 of base flange 76. First stage knurling pattern 78 consists of a plurality of open channels or non-enclosed trenches 82, which are spatially distributed in a repeating geometric pattern. For example, non-enclosed trenches 82 may be spatially distributed in a side-by-side arrangement or stripe-like pattern and may extend substantially parallel to one another as shown. Non-enclosed trenches 82 can be formed to each possess a rectangular or block-shaped cross-sectional geometry, as taken along a section plane orthogonal to the centerline or longitudinal axis of a given trench. In alternative embodiments, non-enclosed trenches 82 may have a different cross-sectional geometry, such as a V-shaped or U-shaped cross-sectional geometry. Furthermore, non-enclosed trenches 82 need not have the identical cross-sectional shapes or dimensions in all embodiments, but may vary from trench-to-trench in, for example, an alternating pattern in further implementations of base flange 76.

First stage knurling pattern 78 can be created in base flange 76 as an integral or original feature, which is formed in flange frontside 80 and, perhaps, in other surfaces of flange 76 upon initial manufacture. Non-enclosed trenches 82 may be integrally formed during initial fabrication of base flange 76 when produced utilizing, for example, die casting, extrusion, or a computer-controlled additive manufacture process, such as Direct Metal Laser Sintering (DMLS) or other three dimensional metal printing process. Alternatively, formation of first stage knurling pattern 87 can be accomplished utilizing various different material shaping or material removal techniques, including wet and dry etching (e.g., reactive ion etching), laser drilling, water jetting, Electro-Discharge Machining (EDM) processes, and stamping. In one useful approach, non-enclosed trenches 82 are formed in flange frontside 80 utilizing a stamping tool or die, such as that described below in conjunction with FIG. 7.

FIG. 7 illustrates a portion of a stamping die 84, which can be utilized to create first stage knurling pattern 78 in flange frontside 80 in various embodiments. Stamping die 84 includes a main body 86 from which a plurality of projections or ribs 88 extend. Ribs 88 are dimensioned and spatially arranged to create non-enclosed trenches 82 in flange frontside 80 when pressed into base flange 76 with sufficient force to displace material as desired. The stamping process may be performed utilizing a hydraulic press or other suitable apparatus, with heat optionally applied to soften base flange 76. In other embodiments, multiple stamping iterations or any combination of the above-listed techniques may be utilized to create first stage knurling pattern 78 in flange frontside 80 and, if appropriate, in other regions of base flange 76. After formation of first stage knurling pattern 78, a material shaping process is next performed to collapse one or more sidewalls of non-enclosed trenches 82 inwardly; that is, toward the respective centerlines or longitudinal axes of trenches 82. Suitable material shaping processes include spanking and stamping, as further discussed below in conjunction with FIGS. 8-12.

Figure 8:
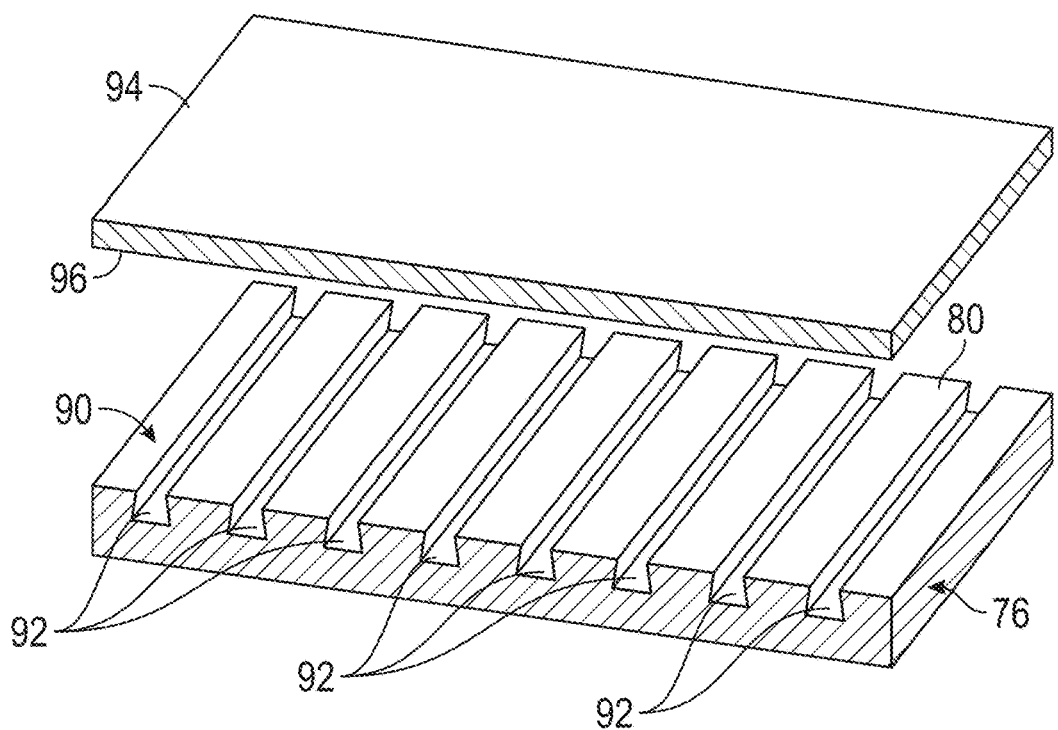

FIG. 8 illustrates base flange 76 (partially shown) after transformation of first stage knurling pattern 78 (FIG. 7) into a final knurling pattern 90. In this example, final knurling pattern 90 consists of a plurality of partially-enclosed trenches 92, which are distributed across the illustrated region of flange frontside 80 in a parallel-extending, side-by-side array. Briefly returning to FIG. 3, such a final knurling pattern 90 may be formed across the entirety of knurled surface region 38 in certain instances; or, instead, final knurling pattern 90 may be formed at selected locations of knurled surface region 38, while other knurling patterns (e.g., those described below in conjunction with FIGS. 10-12) are formed at other locations encompassed by knurled surface region 38. Final knurling pattern 90 is created utilizing a spanking die or blunt 94, a portion of which is further shown in FIG. 8. Spanking blunt 94 includes a lower surface 96 having a substantially planar or flat geometry. During the material shaping process, lower surface 96 of spanking blunt 94 is pressed into flange frontside 80, while base flange 76 in supported in some manner. Sufficient compressive force is applied to compress the knurled portions of base flange 76, and cause the partial inward collapse of the sidewalls of non-enclosed trenches 82 (FIG. 7). The resulting structure in partially-enclosed trenches 92 and final knurling pattern 90.

Figure 9:
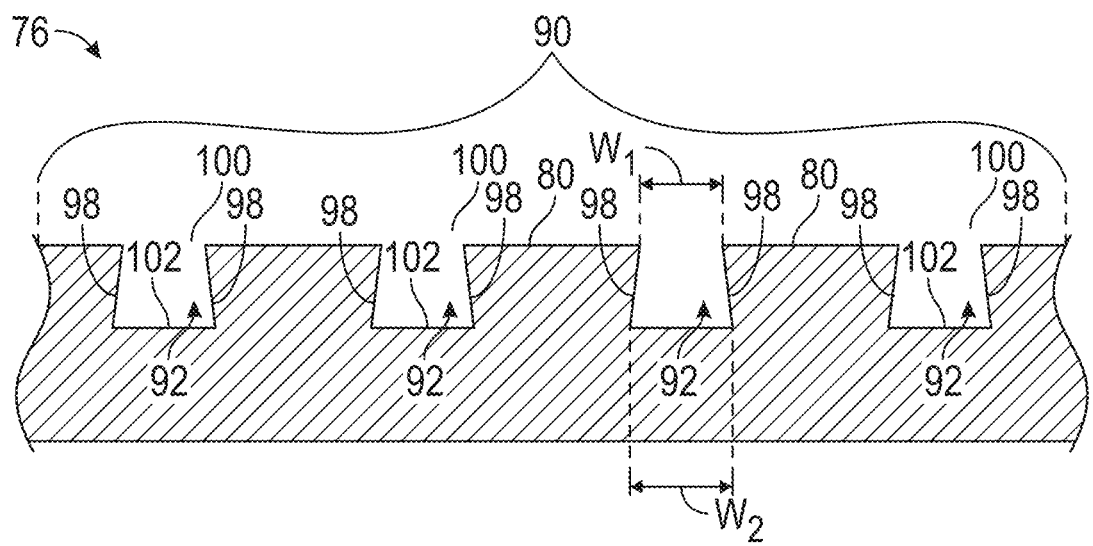

FIG. 9 illustrates a limited number of partially-enclosed trenches 92 in greater detail. Partially-enclosed trenches 92 include trench sidewalls 98, which have been partially collapsed or deformed inwardly pursuant to the above-described spanking process. As can be seen, the inward collapse of trench sidewalls 98 is most pronounced or prominent near the respective mouths 100 of partially-enclosed trenches 92. Accordingly, the average lateral width of partially-enclosed trenches 92 adjacent trench mouths 100 (identified in FIG. 9 by double-headed arrow $W_1$) is less than the average width of trenches 92 adjacent trench bottoms 102 (further identified in FIG. 9 by double-headed arrow $W_2$). The particular relationship between $W_1$ and $W_2$ will vary amongst embodiments, as will the dimensions of partially-enclosed trenches 92; however, by way of non-limiting example, $W_1$ may be at least 10% less than $W_2$ and, perhaps, least 25% less than $W_2$ in at least some embodiments. The trench-to-trench spacing between the upper edges of neighboring trenches 92 will also vary amongst embodiments, but may be greater than $W_1$ in certain implementations.

In the above-described manner, a single material shaping process may be utilized to transform first stage knurling pattern 78 (FIG. 7) into final knurling pattern 90 (FIGS. 8-9), which includes or consists of a partially-enclosed trenches spatially distributed in a repeating geometric arrangement; here, as parallel-extending array of linear trenches or grooves. Advantageously, the above-described spanking process is highly tolerant of die misalignment; the term "die misalignment," as appearing here, referring to the alignment between spanking blunt 94 (FIG. 8) and first stage knurling pattern 78 (FIG. 7) provided in base flange 76. This allows the fabrication of knurled base flange 76 on a repeatable basis to increase throughput, while lowering manufacturing costs. As a potential tradeoff, however, the spanking process may impart material stress to knurled base flange 76 in at least some instances. Such material stress may be relieved, within limits, by heat treatment.

Alternatively, a different material shaping process may be employed to transform first stage knurling pattern 78 into the final knurling pattern. In this regard, a second repeating geometric pattern may be pressed into flange frontside 80 by stamping to produce the final knurling pattern in other manufacturing approaches. Examples of such alternative manufacturing approaches are further discussed below in conjunction with FIGS. 9-10.

Figure 10:
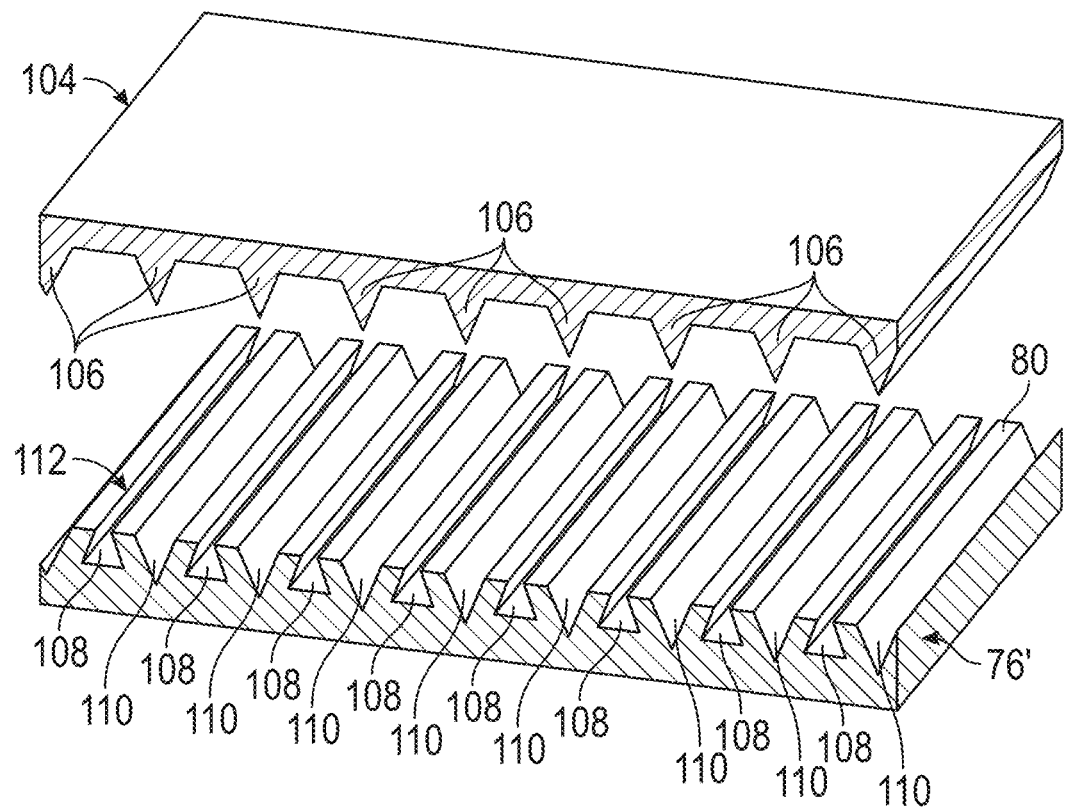
FIGS. 10 and 11 illustrate a limited region of a knurled base flange, such as base flange shown in FIGS. 1-6, imparted with a second exemplary knurling pattern, which can be provided on the base flange in combination with or in lieu of the first knurling pattern shown in FIGS. 7-9.

FIG. 10 illustrates a variation of base flange 76' in which a final knurling pattern 112 is formed in flange frontside 80; the single prime symbol (') indicating that base flange 76' is similar to, but varies relative to the version of base flange 76 shown in FIGS. 8 and 9. As was final knurling pattern 90 (FIGS. 8-9), final knurling pattern 112 is produced by further forming or shaping the portion of flange frontside 76 imparted with first stage knurling pattern 78 (FIG. 7). In the present instance, a stamping die 104, rather than a spanking blunt, is utilized to collapse non-enclosed trenches 82 (FIG. 7) inwardly to arrive at final knurling pattern 112. Specifically, stamping die 104 features a plurality of V-shaped protrusions 106, which are disposed in a side-by-side arrangement or stripe-like array and which extend substantially parallel to one another. When properly aligned with respect to base flange 76' and pressed into flange frontside 80 with adequate force, V-shaped protrusions 106 displace the material of flange 76' to form a number of wedge-shaped channels or V-shaped trenches 110 in flange frontside 80. As V-shaped trenches 110 are formed in flange frontside 80, displaced material drives the inward deformation or collapse of the trench sidewalls of non-enclosed trenches 82 (FIG. 7). Non-enclosed trenches 82 are thus, once again, converted into partially-enclosed trenches 108.

Figure 11:
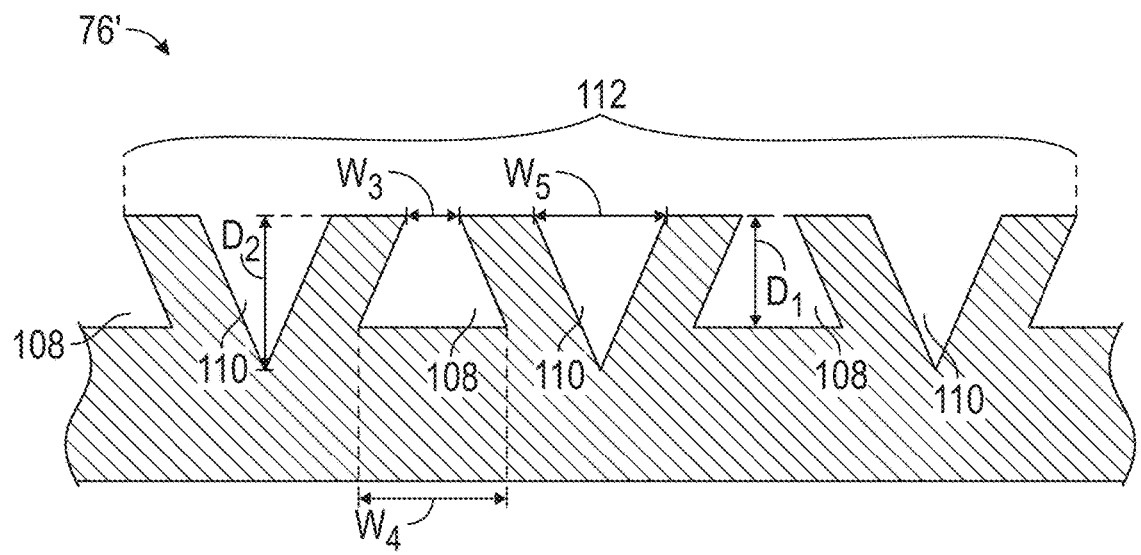

FIG. 11 illustrates, in greater detail, a limited number of V-shaped trenches 110 and partially-enclosed trenches 108 formed in frontside 80 of base flange 76'. As are the other figures accompanying this description, FIG. 11 is not drawn to scale and may include certain dimensions exaggerated for purposes of explanation or emphasis. Referring jointly to FIGS. 10 and 11, partially-enclosed trenches 108 are interspersed with V-shaped trenches 110 in an alternating relationship. Partially-enclosed trenches 108 and V-shaped trenches 110 extend substantially parallel to one another in the depicted embodiment to collectively form a linear array or grouping of parallel-extending linear trenches. In other embodiments, the relative positioning of trenches 108, 110 may vary, as may the respective geometries and dimensions of trenches 108, 110.

Partially-enclosed trenches 108 may have a first average width $W_3$, as measured adjacent the trench mouths or upper openings, and a second average width $W_4$ measured adjacent the trench floors. In the illustrated example, $W_4$ exceeds $W_3$ and, perhaps, may be at least 10% greater than $W_3$. $W_3$ may also be less than the average width $W_5$ of V-shaped trenches 110, as measured at the trench mouths in at least some embodiments. The respective depths of trenches 108, 110 will also vary depending upon design; however, in one non-limiting example, partially-enclosed trenches 108 may have an average depth $D_1$ (as measured from the trench mouth to the trench floor) less than the average depth $D_2$ of V-shaped trenches 110.

In various embodiments, $W_1$ may range from about 2 to about 4 mils and, preferably, from 2.5 to 3.5 mils; $W_2$ may range from about 4 to about 6 mils and, preferably, from 4.5 to 5.5 mils; and $W_3$ may range from about 2 to about 4 mils and, preferably, from 2.5 to 3.5 mils. Comparatively, in such embodiments, $D_1$ may range from about 4 to about 6 mils and, preferably, from 4.5 to 5.5 mils; while $D_2$ may range from about 5 to about 7 mils and, preferably, from 5.5 to 6.5 mils. Such exemplary dimensions may also apply to the embodiments of FIG. 9 and FIGS. 12-14, where appropriate. In other implementations, the respective widths and/or respective depths of trenches 108, 110 may be greater or less than the aforementioned ranges.

Final knurling pattern 112 (FIGS. 10 and 11) can be formed over the entirety or only a portion of knurled surface region 38 (FIG. 3), as determined by design. As indicated above, final knurling pattern 112 enhances bond adherence with the subsequently-produced overmolded package body (e.g., package body 72 shown in FIGS. 4-5) in at least two manners. First, partially-enclosed trenches 108 serve as a relatively large number of small-scale mold lock features, which are filled by mold compound during overmolding as discussed below. Second, the combination of partially-enclosed trenches 108 and V-shaped trenches 110 enlarge or increase the cumulative surface available for bonding to the below-described molded package body. This increase in surface area can be significant and may approach or exceed 85% in certain instances, depending upon the dimensions, spatial positioning, and number of trenches 108, 110 contained in final knurling pattern 112. When incorporating into an overmolded microelectronic package, knurled base flange 76' may thus favorably reduce the likelihood of mold-flange delamination.

Figure 12:
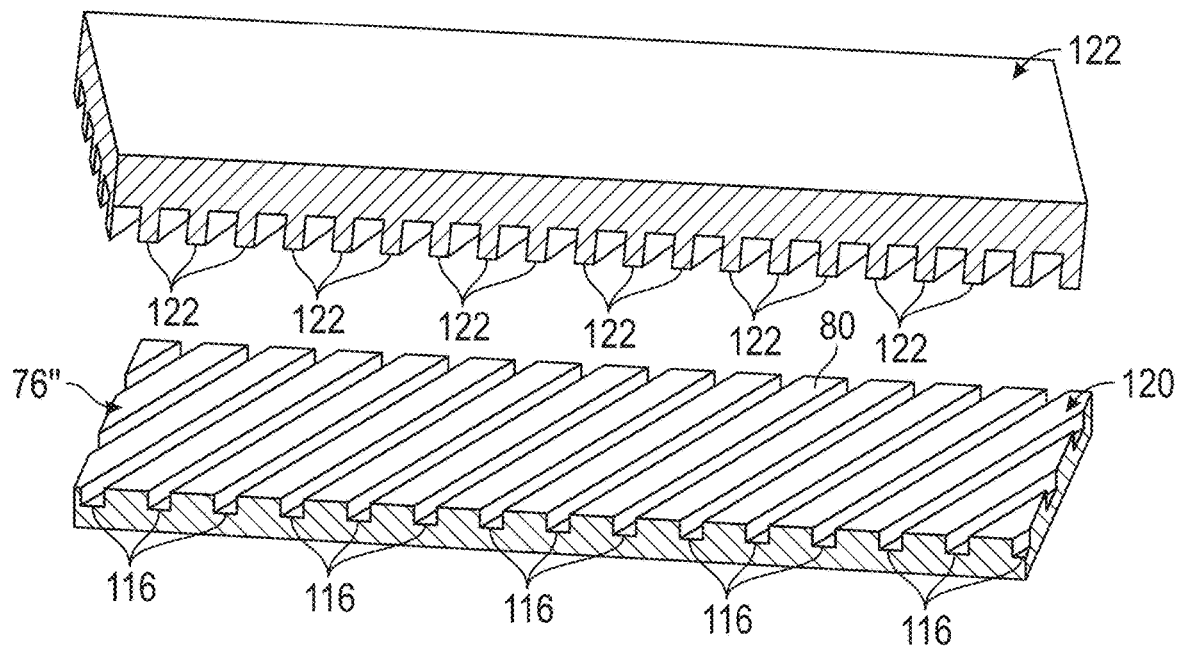
FIGS. 12 and 13 illustrate a limited region of a knurled base flange, such as base flange shown in FIGS. 1-6, imparted with a third exemplary knurling pattern, which can be provided on the base flange in addition to or in lieu of the first knurling pattern shown in FIGS. 7-9 and/or the second knurling pattern shown in FIG. 10.
Figure 13:
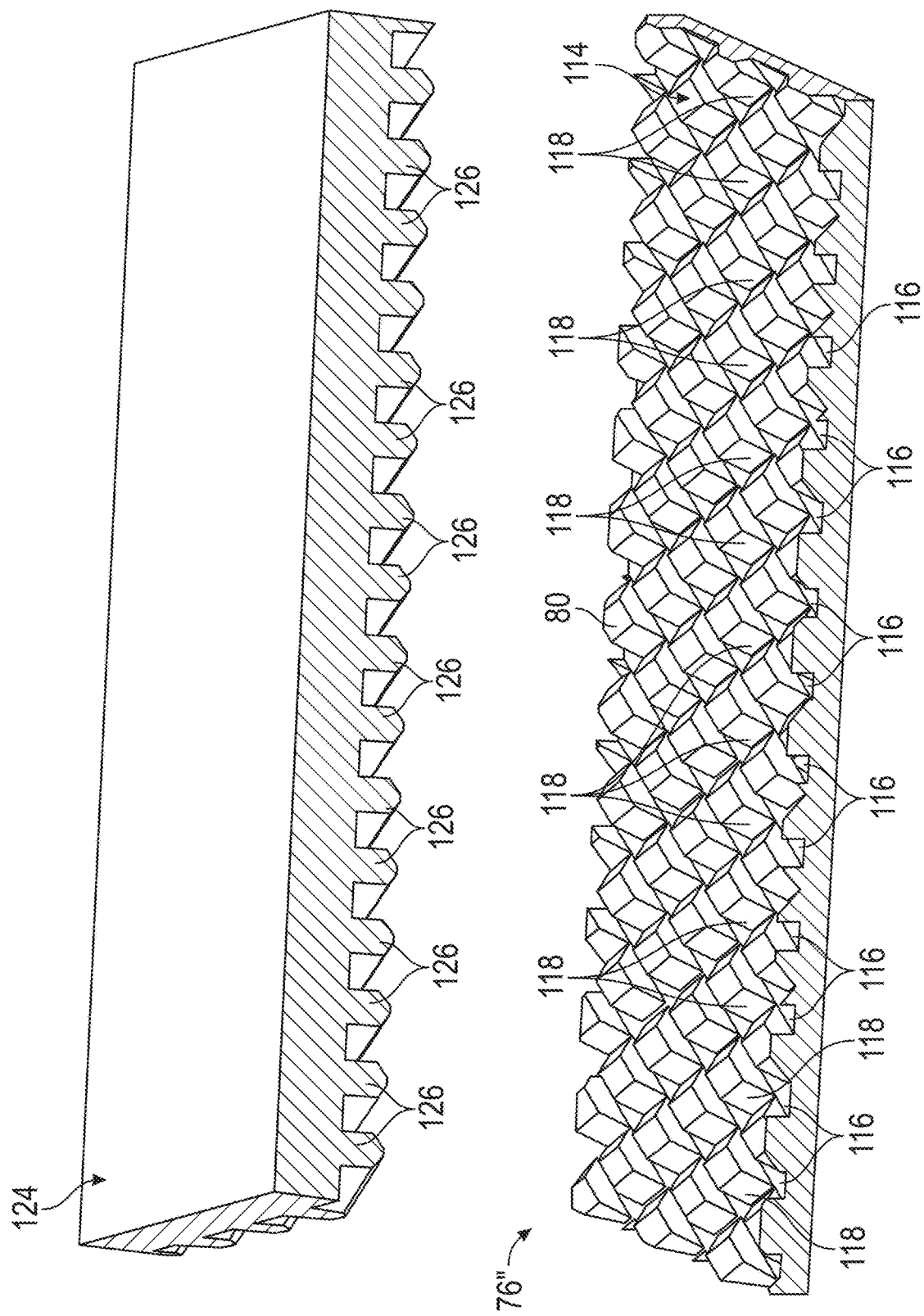

Turning next to FIGS. 12 and 13, there is shown a region of a knurled base flange 76" formed to include a third exemplary final knurling pattern 114; the double prime symbol (") indicating that variation of base flange 76" shown in FIGS. 12-13 is similar to, but differs relative to the variations of base flange 76 and 76' shown in FIGS. 9-11. As shown in FIG. 13, final knurling pattern 114 includes a plurality of V-shaped trenches 118, which overlap with and which have been physically imposed over a plurality of U-shaped trenches 116. Final knurling pattern 114 may be created knurled base flange 76" by initially creating a first stage knurling pattern 120 in flange frontside 80, as shown in FIG. 12. First stage knurling pattern 120 can be created during initial fabrication of base flange 76" in the above-described manner. Alternatively, first stage knurling pattern 120 can be created in base flange 76" utilizing a die 122 having a plurality of ridge-shaped protrusions or ribs 122, which define U-shaped trenches 116 in flange frontside 80 when pressed into base flange 76" with sufficient force, as illustrated in FIG. 12.

A second stamping die 124, partially shown in FIG. 13, is subsequently utilized to impose the pattern of V-shaped trenches 118 over the previously-created pattern of U-shaped trenches 116. Specifically, stamping die 124 includes a plurality of ribs 126, which are shaped, sized, and spatially-distributed to create the desired pattern of V-shaped trenches 118 in frontside 80 At least a majority, if not the substantial entirety of the pattern of V-shaped trenches 118 may be imposed over and, thus, overlap with at least a majority, if not the substantial entirety of the pattern of U-shaped trenches 116. This yields final knurling pattern 114, which contains or consists of a latticework of crisscrossing trenches 116, 118. Stamping with die 124 also potentially drives the inward collapse of certain portions or sections of U-shaped trenches 116 contained in first stage knurling pattern 120 (FIG. 12). This, in turn, imparts such U-shaped trenches 116 with a partially-enclosed cross-sectional geometry at the trench-to-trench intersections or junctures. The particular angle (herein, the "trench pattern intersection angle") formed between any given one of partially-enclosed trenches 116 and any intersecting one of parallel-extending trenches 118 will vary amongst embodiments. However, by way of non-limiting example, the trench pattern intersection angle may be acute and, perhaps, may range between about 10 and about 80 degrees in embodiments. Final knurling pattern 114 may achieve a favorable surface area enlargement comparable to that achieved by final knurling pattern 112 shown in FIGS. 11-12, while also being less susceptible to misalignment between the stamping utilized to create V-shaped trenches 118 and first stage knurling pattern 78.

Figure 14:
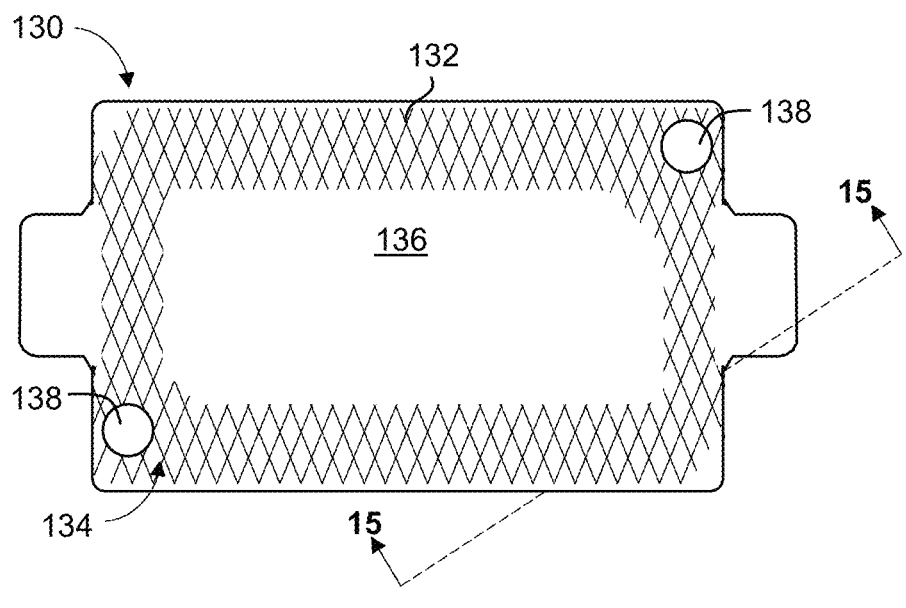
FIG. 14 is a picture of an exemplary base flange reduced to practice and including a knurled surface region in which a plurality of V-shaped trenches are imposed over a plurality of U-shaped trenches to form an intersecting latticework of trenches.
Figure 15:
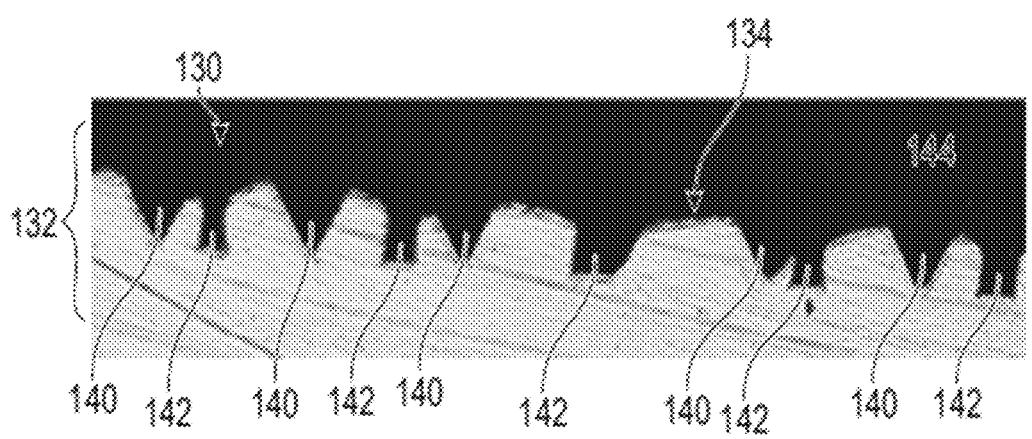
FIG. 15 is a scanning electron microscope image of a limited portion of the knurled surface region of the exemplary base flange shown in FIG. 14 after formation of a molded package body thereover.

Referring lastly to FIGS. 14 and 15, there is shown an exemplary implementation of a base flange 130, which features at least one knurled surface region 132 and which was reduced to practice. As best shown in FIG. 14, knurled surface region 132 is formed on and extends around an outer peripheral portion of frontside 134 of base flange 130. Knurled surface region 132 likewise extends around a device attachment region 136 to border region 136 on all sides. Two locating or retention posts 138 project upwardly from flange frontside 134 and, specifically, from knurled surface region 132. Knurled surface region 132 is similar or substantially identical to knurled surface region 114 of base flange 76" shown in FIG. 13; noting that the irregularities in trench spacing and cross-sectional shape are a product of real-world manufacturing variances and the angled orientation of cross-section plane 15-15 (identified in FIG. 14). As was previously the case, and as shown most clearly in the scanning electronic microscope (SEM) image of FIG. 15, knurled surface region 132 includes a plurality of V-shaped trenches 140, which are imposed over a plurality of U-shaped trenches 142. Collectively, V-shaped trenches 140 and U-shaped trenches 142 form an intersecting latticework or cross-hatching of trenches 140, 142.

Numerous trench-to-trench intersections are thus created between V-shaped trenches 140 and U-shaped trenches 142. Adjacent each of these trench-to-trench intersections, overhang features are created to partially enclose or cover U-shaped trenches 142. Specifically, the sidewalls of U-shaped trenches 142 have been collapsed inwardly pursuant to the stamping process utilized to create V-shaped trenches 140. The sidewalls of U-shaped trenches 142 thus converge when moving from the trench floors toward the trench mouths. As shown in FIG. 15, an overmolded package body 144 is subsequently formed over base flange 130 and contacts knurled surface region 132, perhaps covering region 132 in its substantial entirety. The material of overmolded package body 144 extends into and fills trenches 140, 142 to create a highly robust mechanical bond between package body 144 and base flange 130. The robustness of this mechanical bond is creditable to an increase in bondable surface area brought about by formation of trenches 140, 142 in flange frontside 134, as well as the provision of overhang or mold lock features in the form of the partially-collapsed trench walls of U-shaped trenches 142.

Testing was conducted to compare the mold-flange delamination resistance of knurled base flange 130 (FIGS. 14 and 15) to a conventional base flange of equivalent dimensions and having a half dove tail mold lock feature similar or identical to that shown in FIG. 1. After overmolding and mounting of GaN die, both test models were exposed to an equivalent number of thermal cycles. During thermal cycling, each overmolded microelectronic package was exposed to repeated temperature cycles having minimum temperatures of approximately −40 degrees Celsius and maximum temperatures of approximately 125 degrees Celsius. After 850 thermal cycles, inspection was performed by observing the ingress of a dyed potting compound into the interface or physical boundary between the molded package bodies and base flanges. Significant ingress of the dyed potting compound into the mold-flange interface of the conventional base flange was observed evidencing severe mold-flange delamination and failure of the traditional mold lock feature. Comparatively, little to no ingress of the dyed potting compound was observed for the overmolded microelectronic package incorporating knurled base flange 130. Thus, the overmolded package body incorporating knurled base flange 130 demonstrated an enhanced ability to withstand such repeated, extreme thermal cycling conditions without mold-flange delamination, even when containing semiconductor die composed of relatively stiff materials.

CONCLUSION

The foregoing has provided embodiments of knurled base flanges that, when integrated into overmolded microelectronic packages, enhance mold-flange bond adhesion. Embodiments of the above-described knurled base flanges are produced to include at least one knurling pattern, which may extend around a device attachment region and possibly may occupy a majority of the surface area of the flange frontside not covered by the microelectronic device or devices contained within the package. In certain embodiments, the final knurling pattern may include partially-enclosed trenches, which serve as small scale mold lock features. Additionally or alternatively, the final knurling pattern may include two or more trench patterns, which are overlaid such that the trenches contained in the first trench pattern extend substantially parallel to or, instead, intersect the trenches contained in the second trench pattern. In many instances, such knurling patterns can be created within a base flange utilizing processes that are relatively tolerant, if not largely impervious to die misalignment. Due, at least in part, to this easing of alignment tolerances, embodiments the knurled base flange can be produced on a repeatable basis to boost throughput, while reducing manufacturing costs. Incorporation of the knurled base flange into an overmolded microelectronic package decreases the likelihood of mold-flange delamination during package usage, as may be particularly beneficial when the microelectronic package is exposed to highly elevated operating temperatures and/or contains semiconductor die composed of GaN or another high stiffness material.

In various embodiments, the overmolded microelectronic package includes a molded package body, at least one microelectronic device contained in the molded package body, and a base flange to which the molded package body is bonded. The base flange includes, in turn, a flange frontside contacted by the molded package body, a device attachment region located on the flange frontside and to which the at least one microelectronic is mounted, and a knurled surface region. The knurled surface region includes a first plurality of trenches formed in the base flange and arranged in a first repeating geometric pattern. The molded package body extends or projects into the first plurality of trenches to decrease the likelihood of delamination of the molded package body from the base flange. In certain embodiments in which the flange frontside has a total surface area $A_1$ contacted by the molded package body, the knurled surface region nay occupy at least a majority of the total surface area $A_1$. In other embodiments wherein the knurled surface region further includes a second plurality of trenches arranged in a second repeating geometric pattern, at least a majority of the second repeating geometric pattern overlapping with at least a majority of the first geometric pattern.

Methods for fabricating overmolded microelectronic packages have also been provided. In embodiments, the method includes the step of purchasing, fabricating, or otherwise obtaining a base flange having a flange frontside and a knurled surface region. The knurled surface region includes a first plurality of trenches formed in the base flange and arranged in a repeating geometric pattern. An overmolding process is performed during which a heated mold compound is directed onto the base flange and flows into the first plurality of trenches. The heated mold compound cools and solidifies to form a molded package body, which is bonded to the base flange and which covers at least a majority of the knurled surface region. Before or after the overmolding process, at least one microelectronic device is attached to the flange frontside. In certain implementations, the knurled surface region may be formed in the base flange by: (i) providing a first stage knurling pattern in the knurled surface region, the first stage knurling pattern comprising non-enclosed trenches having trench sidewalls; and (ii) after forming the first stage knurling pattern, conducting a material shaping process, such as spanking, to deform the trench sidewalls inwardly and transform the non-enclosed trenches into the plurality of partially-enclosed trenches. In other implementations, the knurled surface region may be formed in the base flange by: (i) pressing a first trench pattern into the flange frontside utilizing a first stamping die; and (ii) pressing a second trench pattern into the flange frontside utilizing a second stamping die, at least a majority of the second trench pattern overlapping with at least a majority of the first trench pattern. This may yield a latticework of intersecting or crisscrossing trenches, which extends around an outer peripheral portion of the flange frontside.

Methods for producing knurled base flanges of the type utilized in the manufacture of overmolded microelectronic packages have further been disclosed. In certain implementations, the method includes the step or process of obtaining a base flange includes a flange frontside, a device attachment region on the flange frontside, and a first stage knurling pattern comprising a plurality of U-shaped trenches formed in the base flange and arranged in a first repeating geometric pattern. The first stage knurling pattern is converted or transformed into a final knurling pattern by subjecting the base flange to at least one material shaping or forming process. The at least one material shaping process creates overhang features partially enclosing the plurality of U-shaped trenches. In at least some embodiments, the step or process of transforming includes subjecting the base flange to at least one of: (i) a spanking process during which a spanking blunt is utilized to apply a controlled compressive force across the first stage knurling pattern to partially collapse the plurality U-shaped trenches; and (ii) a stamping process during which a plurality of V-shaped trenches are pressed into the base flange at a location overlapping the plurality of U-shaped trenches.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for producing an overmolded microelectronic package, the method comprising:
   obtaining a base flange having a flange frontside, a device attachment region, and a knurled surface region, the knurled surface region comprising a first plurality of trenches formed in the base flange, within a border region of the device attachment region, wherein the first plurality of trenches comprises a plurality of U-shaped trenches arranged in a first repeating geometric pattern and a plurality of V-shaped trenches arranged in a second repeating geometric pattern, wherein the first and second repeating geometric patterns are physically imposed over each other, wherein successive instances of the first and second repeating geometric patterns are immediately and continuously adjacent one another, and wherein the plurality of V-shaped trenches intersects the plurality of U-shaped trenches at a trench pattern intersection angle $\theta_1$, and wherein $10°<\theta_1<80°$;
   performing an overmolding process during which a heated mold compound is directed onto the base flange and flows into the first plurality of trenches, the heated mold compound cooling to form a molded package body bonded to the base flange and covering at least a majority of the knurled surface region; and
   before or after the overmolding process, attaching at least one microelectronic device to the flange frontside.

2. The method of claim 1, further comprising:
   forming the knurled surface region in the base flange by providing a first stage knurling pattern in the knurled surface region, the first stage knurling pattern comprising non-enclosed trenches having trench sidewalls; and
   after forming the first stage knurling pattern, conducting a material shaping process to deform the trench sidewalls inwardly and transform the non-enclosed trenches into a plurality of partially-enclosed trenches.

3. The method of claim 2 wherein conducting comprises performing a spanking process during which the knurled surface region is compressed utilizing a spanking blunt to partially collapse the non-enclosed trenches.

4. The method of claim 1 wherein the knurled surface region is formed in the base flange by:
   pressing a first trench pattern into the flange frontside utilizing a first stamping die, wherein the first trench pattern includes one of the plurality of U-shaped trenches or the plurality of V-shaped trenches; and
   pressing a second trench pattern into the flange frontside utilizing a second stamping die, at least a majority of the second trench pattern overlapping with at least a majority of the first trench pattern, and wherein the second trench pattern includes another one of the plurality of U-shaped trenches or the plurality of V-shaped trenches.

5. The method of claim 4 wherein the plurality of U-shaped trenches comprises a first plurality of non-enclosed trenches arranged in the first repeating geometric pattern and each having a substantially rectangular cross-sectional geometry; and
wherein the plurality of V-shaped trenches comprises a second plurality of non-enclosed trenches arranged in the second repeating geometric pattern and each having a substantially wedge-shaped cross-sectional geometry.

6. The method of claim 5 wherein the first trench pattern and second trench pattern combine to form a latticework of intersecting trenches extending around an outer peripheral portion of the flange frontside.

7. The method of claim 1, wherein the knurled surface region extends at least partially around an outer peripheral portion of the flange frontside.

8. The method of claim 1, wherein the overmolded microelectronic package further includes at least one microelectronic device contained in the molded package body and mounted to the device attachment region.

9. The method of claim 8, wherein the knurled surface region extends around the device attachment region.

10. The method of claim 1, wherein the flange frontside has a total surface area $A_1$ contacted by the molded package body, and wherein the knurled surface region occupies at least a majority of the total surface area $A_1$.

11. A method for producing a knurled base flange utilized in the manufacture of an overmolded microelectronic package, the method comprising:
obtaining a base flange, the base flange comprising:
a flange frontside;
a device attachment region on the flange frontside; and
a first stage knurling pattern comprising a plurality of U-shaped trenches formed in the base flange and arranged in a first repeating geometric pattern; and
transforming the first stage knurling pattern into a final knurling pattern by subjecting the base flange to at least one material shaping process in a border region of the device attachment region, the at least one material shaping process creating overhang features partially enclosing the plurality of U-shaped trenches, wherein successive instances of U-shaped trenches of the plurality of U-shaped trenches are continuously and immediately adjacent one another, and wherein a plurality of V-shaped trenches intersects the plurality of U-shaped trenches at a trench pattern intersection angle $\theta 1$, and wherein $10° < \theta 1 < 80°$.

12. The method of claim 11 wherein transforming comprises subjecting the base flange to a spanking process during which a spanking blunt is utilized to apply a controlled compressive force across the first stage knurling pattern to partially collapse the plurality U-shaped trenches.

13. The method of claim 11 wherein transforming comprises subjecting the base flange to a stamping process during which the plurality of V-shaped trenches are pressed into the base flange at a location overlapping the plurality of U-shaped trenches.

14. A method for producing an overmolded microelectronic package, the method comprising:
obtaining a base flange that comprises
a flange frontside,
a knurled surface region comprising:
a first plurality of trenches formed in the flange frontside and arranged in a first repeating geometric pattern; and
a second plurality of trenches formed in the flange frontside and arranged in a second repeating geometric pattern, at least a majority of the second repeating geometric pattern overlapping with at least a majority of the first repeating geometric pattern, wherein, in regions in which the second repeating geometric pattern overlaps with the first repeating geometric pattern, the second plurality of trenches intersects the first plurality of trenches to form a lattice work of crisscrossing trenches, wherein the second plurality of trenches intersects the first plurality of trenches at a trench pattern intersection angle $\theta 1$, and wherein $10° < \theta 1 < 80°$, and wherein successive instances of the first geometric pattern and the second geometric pattern are immediately adjacent one another; and
a device attachment region located on the flange frontside, wherein the device attachment region has a planar topology, while the knurled surface region extends at least partially around the device attachment region;
performing an overmolding process during which a heated mold compound is directed onto the base flange and flows into the first plurality of trenches and into the second plurality of trenches, the heated mold compound cooling to form a molded package body bonded to the base flange and covering at least a majority of the knurled surface region; and
before or after the overmolding process, attaching at least one microelectronic device to the device attachment region of the flange frontside.

15. The method of claim 14 wherein the knurled surface region further comprises:
trench-to-trench intersections formed between the first plurality of trenches and the second plurality of trenches; and
overhang features partially enclosing the first plurality of trenches at the trench-to-trench intersections.

* * * * *